United States Patent [19]
Usui et al.

[11] Patent Number: 5,345,094
[45] Date of Patent: Sep. 6, 1994

[54] LIGHT TRIGGERED TRIAC DEVICE AND METHOD OF DRIVING THE SAME

[75] Inventors: Yasunori Usui, Yokohama; Shinjiro Yano, Himeji, both of Japan

[73] Assignee: Kabushiki Kaisha Toshiba, Kawasaki, Japan

[21] Appl. No.: 86,300

[22] Filed: Jul. 6, 1993

[30] Foreign Application Priority Data

Jul. 6, 1992 [JP] Japan .................................. 4-178157

[51] Int. Cl.$^5$ ........................................... H01L 29/74
[52] U.S. Cl. .................................... 257/113; 257/114; 257/119; 257/122; 257/162
[58] Field of Search ................ 257/119, 122, 113, 114, 257/115, 116, 162, 167, 168

[56] References Cited

U.S. PATENT DOCUMENTS

| | | | |
|---|---|---|---|
| 4,001,866 | 1/1977 | Kravitz et al. | 257/113 |
| 4,001,867 | 1/1977 | Kravitz et al. | 257/113 |
| 4,613,884 | 9/1986 | Angerstein et al. | 257/115 |

FOREIGN PATENT DOCUMENTS

| | | | |
|---|---|---|---|
| 3837747 | 5/1990 | Fed. Rep. of Germany | 257/119 |
| 4029121 | 3/1991 | Fed. Rep. of Germany | 257/119 |
| 53-25386 | 3/1978 | Japan | 257/114 |
| 1289177 | 11/1989 | Japan | 257/113 |

OTHER PUBLICATIONS

Storm et al, "A Bilateral Silicon Switch," *IEEE Transactions on Electron Devices,* vol. ED-14, No. 6, Jun. 1967, pp. 330-333.

L. Leipold, et al., "FET-Triggered Lateral Opto-Triac", *IEDM 82,* 1982, pp. 261-263.

*Primary Examiner*—William Mintel
*Attorney, Agent, or Firm*—Oblon, Spivak, McClelland, Maier & Neustadt

[57] ABSTRACT

Disclosed is a semiconductor device comprising an output Triode AC switch with a vertical structure, which is provided in a silicon substrate and has a gate, a first output terminal and a second output terminal, and an input/driving photo Triode AC switch, which is provided in the substrate and has a light-receiving portion, a first terminal connected to the gate and a second terminal connected to the second output terminal. The output Triode AC switch with a vertical structure is turned on when light is input to the photo Triode AC switch.

7 Claims, 9 Drawing Sheets

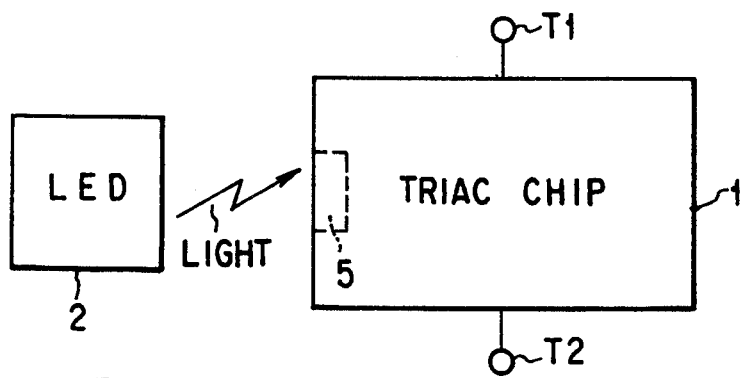
F I G. 1
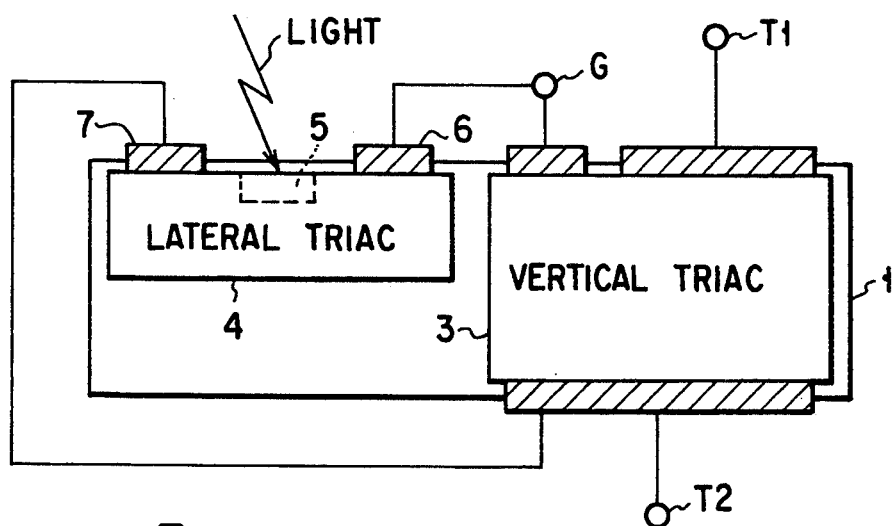
F I G. 2
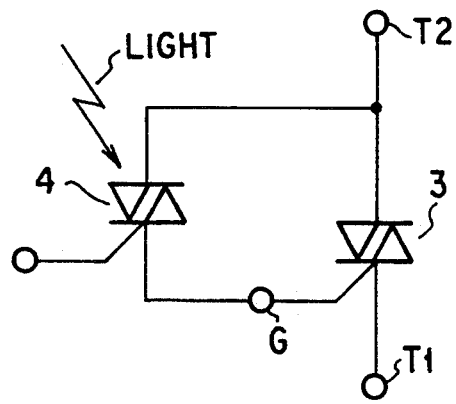
F I G. 3

LIGHT TRIGGERED TRIAC DEVICE AND METHOD OF DRIVING THE SAME

BACKGROUND OF THE INVENTION

1. Field of the Invention

The present invention relates to a triac device and a method of driving the same, and, more particularly, to a triac which is triggered by light and a method of driving the same.

2. Description of the Related Art

L. Leipold et al., "600 V/5A FET TRIGGERED LATERAL OPTO TRIAC," IEDM 1982, pp. 261-263 discloses a light triggered triac device (hereinafter referred to as "phototriac") which has a lateral structure to have all the active regions arranged on the same major surface of a semiconductor device in a specific manner so that the triac can be triggered by light.

As this phototriac device has all the active regions arranged only on one major surface of a semiconductor chip, the current density per unit area of the chip is very small. This triac cannot therefore be used as a power controller to control a high voltage and large current.

SUMMARY OF THE INVENTION

It is therefore an object of the present invention to provide a phototriac device, which is designed to overcome the above shortcoming and can thus be used as a power controller to control a high voltage and large current, and a method of driving the same.

To achieve the foregoing and other objects and in accordance with the purpose of the present invention, a phototriac device according to this invention comprises an output-stage triac having a vertical structure and an optical triac for generating a current when irradiated with a light input and supplying this current to the output-stage triac, both triacs formed in the same semiconductor substrate.

According to this invention, the optical triac and the output-stage triac are both formed in one substrate, and the output-stage triac has a vertical structure to allow a current to flow between the top and bottom surfaces of the substrate. This design can ensure a higher current density per chip's unit area than the conventional triac which has all the functional regions provided only on one major surface of the substrate. The triac device of the present invention can therefore be used as a power controller to control a high voltage and large current.

Further, the optical triac has a lateral structure and has a light-receiving portion formed inside, so that it is triggered by light input to this light-receiving portion. Accordingly, the phototriac of the present invention can control large power of several tens of amperes with a minute light signal.

According to a method of driving a phototriac device of the present invention, to drive the phototriac device, an AC voltage is applied between both electrodes of the output-stage triac to launch light to the input-stage phototriac.

Upon receiving a light input, the phototriac can directly drive and control the output-stage triac. In this case, a gate trigger current of an operation mode 1 (+) or a gate trigger current of an operation mode 3 (−) is supplied to the output-stage triac in accordance with the potential difference between the voltages applied to both electrodes of the output-stage triac.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram schematically illustrating a phototriac device according to the present invention;

FIG. 2 is a block diagram illustrating the structure of a triac chip shown in FIG. 1;

FIG. 3 is a circuit diagram of the triac chip shown in FIG. 1;

DETAILED DESCRIPTION OF THE PREFERRED EMBODIMENTS

Figure 4:
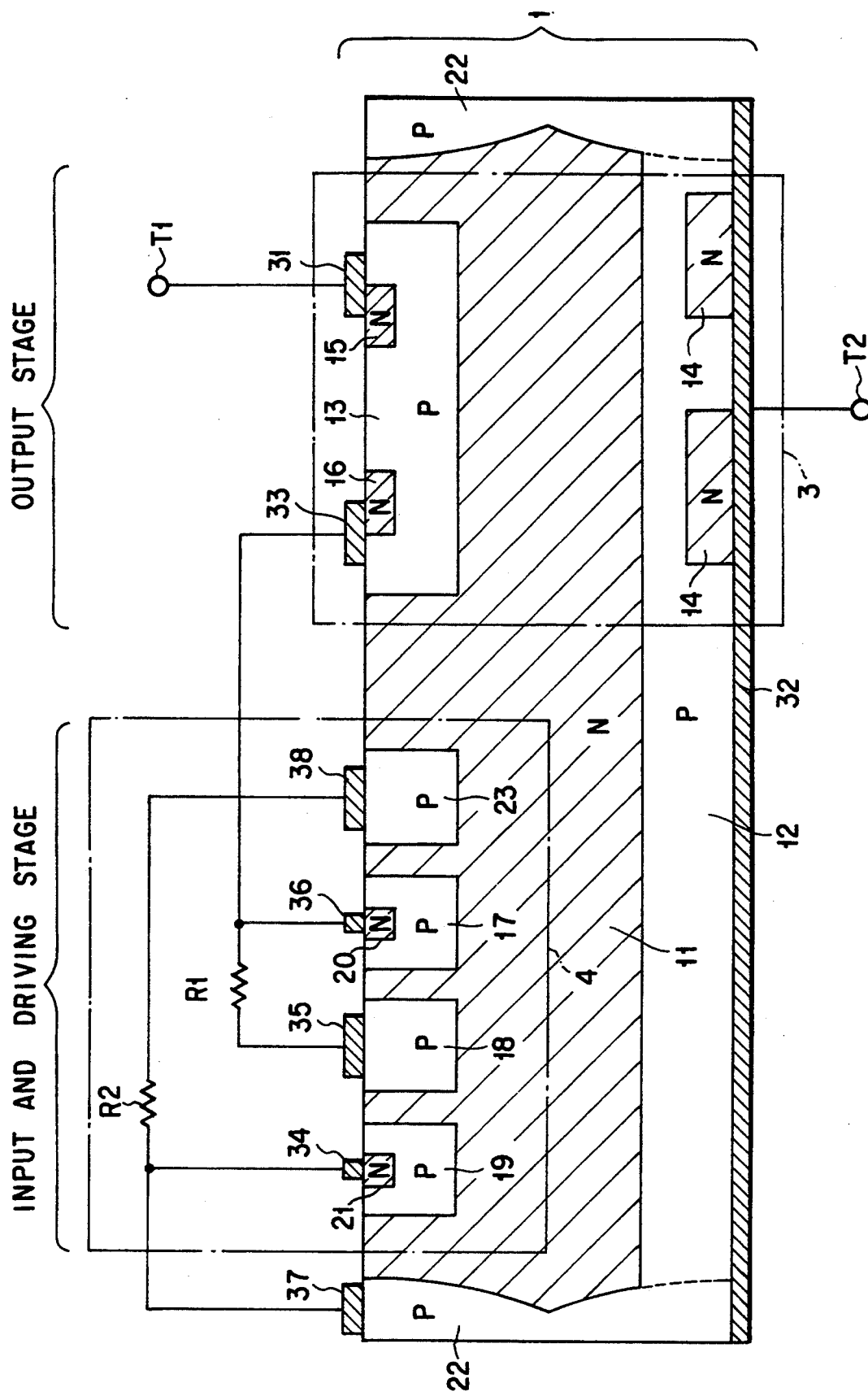
FIG. 4 is a cross section of a phototriac device according to a first embodiment of the present invention.

Phototriac devices according to preferred embodiments of the present invention will now be described referring to the accompanying drawings. Like reference numerals or characters are used to designate corresponding or identical parts throughout the entire diagrams to avoid any redundant description.

FIG. 1 presents a block diagram schematically illustrating a phototriac device according to the present invention.

As shown in FIG. 1, a triac chip 1 has a first terminal for receiving an alternate voltage T1, a second terminal for receiving the alternate voltage T2 and a light-receiving portion 5. The light-receiving portion 5 receives a light signal from a light emitting unit 2, such as a Light-emitting diode (LED). Upon reception of this light input, the triac chip 1 is activated.

FIG. 2 presents a block diagram illustrating the structure of the triac chip 1 shown in FIG. 1.

As shown in FIG. 2, a vertical triac 3 and a lateral triac 4 are formed in the triac chip 1. The first and second terminals T1 and T2 are provided on the vertical triac 3. The light-receiving portion 5 is provided in the lateral triac 4. The lateral triac 4 has a first terminal 6 connected to the gate G of the vertical triac 3 and a second terminal 7 connected to the second terminal T2.

FIG. 3 presents a circuit diagram of the triac chip 1 shown in FIG. 1.

As shown in FIG. 3, in the phototriac device of this invention, the lateral triac 4 for receiving a light signal is Darlington-connected to the vertical triac 3. With this structure, the phototriac device of this invention can control large power of several tens of amperes with a minute light signal.

FIG. 4 shows the cross section of a phototriac device according to a first embodiment of this invention.

As shown in FIG. 4, an output-stage triac 3 and an input/driving-stage triac 4 are integrated in a chip 1. The output-stage triac 3 is constituted of a vertical triac having a vertical structure, and the input/driving-stage triac 4 of a lateral triac having a lateral triac. The lateral triac in this invention is a phototriac which is triggered by a light input.

As shown in FIG. 4, the chip 1 comprises an N type silicon layer 11, a P type silicon layer 12 formed in a first major surface region of the N type silicon layer 11, electrodes (denoted by "31," "33," "34," "35," "36," "37" and "38") formed on the top surface of the N type silicon layer 11, and an electrode (denoted by "32") formed on the top surface of the P type silicon layer 12. The region where a triac is to be formed is formed in the N type silicon layer 11, extending from the first major surface thereof to the second major surface, and is surrounded by a P type isolation region 22 that is in contact with the P type silicon layer 12. The electrode 37 is a first terminal electrode formed in contact with the top surface of the P type isolation region 22.

In the output-stage triac 3, the region denoted by reference numeral "13" is a P type semiconductor layer formed in the second major surface region of the N type silicon layer 11, the region denoted by reference numeral "14" is an N type semiconductor layer formed in the surface region of the P type silicon layer 12, and the regions denoted by reference numerals "15" and "16" are N type semiconductor layers formed in the surface region of the P type semiconductor layer 13.

In the output-stage triac 3, the electrode 31 is a second terminal electrode formed in contact with both surfaces of the P type semiconductor layer 13 and N type semiconductor layer 15, the electrode 32 is a third terminal electrode formed in contact with both surfaces of the P type silicon layer 12 and N type semiconductor layer 14, and the electrode 33 is a gate electrode formed in contact with both surfaces of the P type semiconductor layer 13 and N type semiconductor layer 16.

The second terminal electrode 31 is connected to the first terminal T1 shown in FIGS. 1 through 3, and the third terminal electrode 32 to the second terminal T2 also shown in FIGS. 1-3.

In the input/driving-stage triac 4, the regions denoted by reference numerals "17," "18," "19" and "23" are P type semiconductor layers separately formed in the surface region of the N type silicon layer 11. The region denoted by reference numeral "20" is an N type semiconductor layer formed in the surface region of the P type semiconductor layer 17, and the region denoted by reference numeral "21" is an N type semiconductor layer formed in the surface region of the P type semiconductor layer 19.

In the input/driving-stage triac 4, the electrode 34 is a fourth terminal electrode formed in contact with the N type semiconductor layer 21, the electrode 35 is a fifth terminal electrode formed in contact with the P type semiconductor layer 18, the electrode 36 is a sixth terminal electrode formed in contact with the N type semiconductor layer 20, and the electrode 37 is a seventh terminal electrode formed in contact with the P type semiconductor layer 23. The fourth terminal electrode 34 is electrically connected to the first terminal electrode 37. The fifth terminal electrode 35 is electrically connected to the first terminal electrode 37 via a resistor R1. The sixth terminal electrode 36 is electrically connected to the gate electrode 33, while the seventh terminal electrode 38 is electrically connected to the fourth terminal electrode 34 via a resistor R2.

Those electrical connections are accomplished by aluminum lines formed on the surface of the chip 1. The resistors R1 and R2 are provided to cause a potential difference with the current that flows when a light signal is input to the input/driving-stage triac 4. The resistors R1 and R2 are formed of a polysilicon line to have a resistance of about 10 Ω, for example.

The fifth terminal electrode 35, sixth terminal electrode 36 and resistor R1 constitute the first terminal 6 shown in FIG. 2. Therefore, the fifth terminal electrode 35 and sixth terminal electrode 36 are connected to the gate electrode 33.

The fourth terminal electrode 34, seventh terminal electrode 38 and resistor R2 constitute the second terminal 7 shown in FIG. 2. Therefore, the fourth terminal electrode 34 and seventh terminal electrode 38 are connected to the third terminal electrode 32 (second output terminal T2) via the first terminal electrode 37 and the isolation region 22.

The function of the phototriac device will now be described.

In driving the above-described phototriac device, an AC voltage is applied between the first terminal electrode 31 (first terminal T1) and the second terminal electrode 32 (second terminal T2) of the output-stage triac 3, and light is irradiated on the input/driving-stage triac 4. When receiving the light input, the input/driving-stage triac 4 generates a current. The input/driving-stage triac 4 supplies this current to the gate electrode 33 of the output-stage triac 3, whereby the input/driving-stage triac can directly drive and control the output-stage triac 3.

Figure 5:
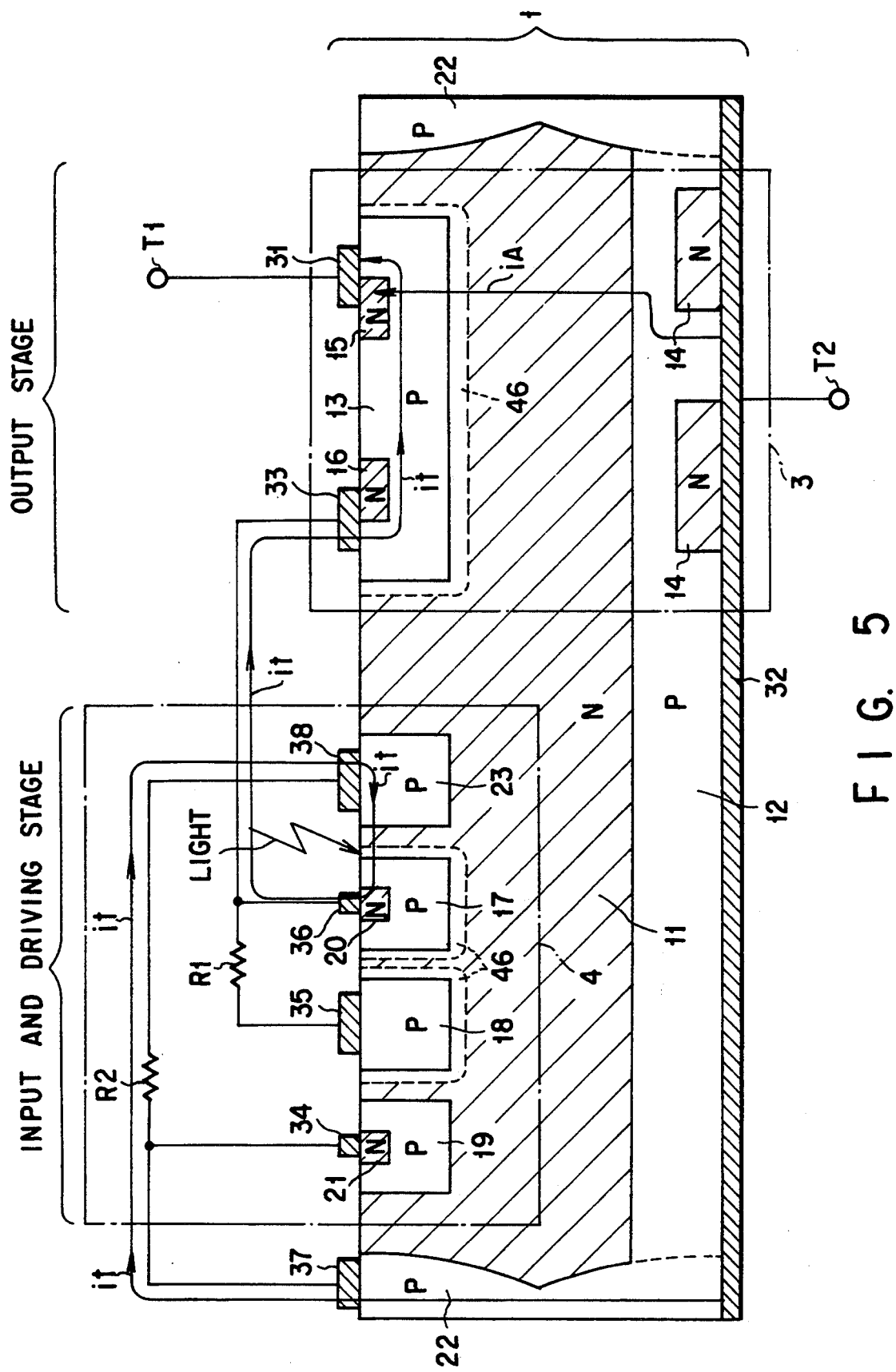
FIG. 5 is a first cross-sectional view for explaining the function of the phototriac device according to the first embodiment of the present invention.

When the voltage applied to the second terminal T2 is higher than the voltage applied to the first terminal T1, as shown in FIG. 5, depletion layers 46 are formed between the P type semiconductor layer 13, P type semiconductor layer 17 and P type semiconductor layer 18, and the N type silicon layer 11. Under this situation, when light is irradiated on the junction between the P type semiconductor layer 17 and N type silicon layer 11, multiple pairs of electrons and holes are produced in the depletion layer 46 around the P type semiconductor layer 17. The pairs of electrons and holes are separated by an electric field, so that the holes move into the P type semiconductor layer 17 and the electrons move into the N type silicon layer 11. This raises the potential of the P type semiconductor layer 17 with respect to the N type semiconductor layer 20, thus starting the injection of the electrons from the N type semiconductor layer 20 into the P type semiconductor layer 17. As a result, the lateral thyristor which is constituted of the sixth terminal electrode 36, N type semiconductor layer 20, P type semiconductor layer 17, N type silicon layer 11, P type semiconductor layer 23 and seventh terminal electrode 38 is turned on.

Figure 6:
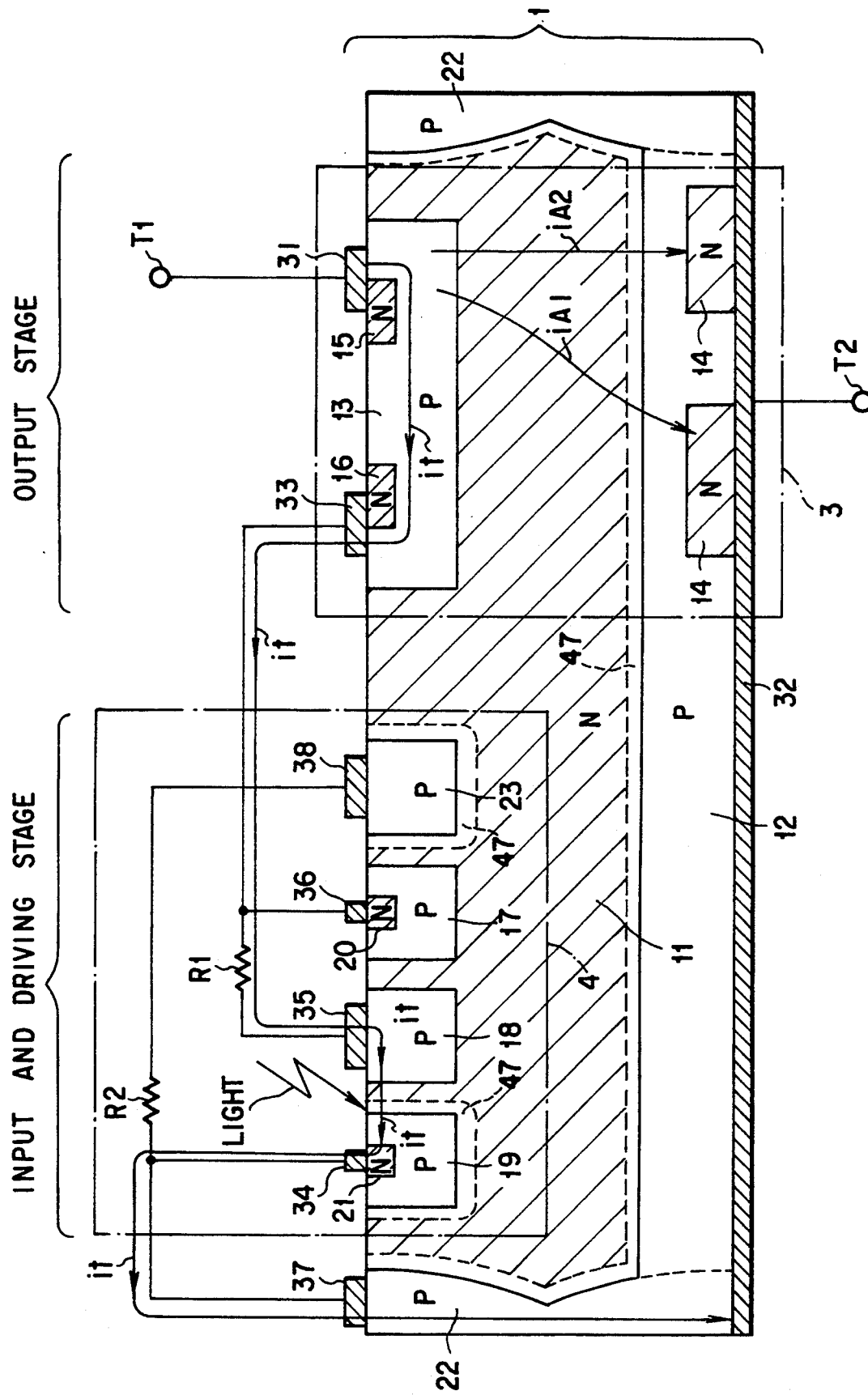
FIG. 6 is a second cross-sectional view for explaining the function of the phototriac device according to the first embodiment of the present invention.

When the lateral thyristor is turned on, a current it flows through a route of the third terminal electrode 32, isolation region 22, first terminal electrode 37, resistor R2, seventh terminal electrode 38, P type semiconductor layer 23, N type silicon layer 11, P type semiconductor layer 17, N type semiconductor layer 20, gate electrode 33 and P type semiconductor layer 13. This current it becomes a gate trigger current of an operation mode 1 (+) for the output-stage triac 3, so that the output-stage triac 3 is activated in operation mode 1 (+). In this mode 1 (+), the voltage of the gate electrode 33 is higher than that of the second terminal electrode 31, causing a current iA to flow from the third terminal electrode 32 to the second terminal electrode 31.

when the voltage applied to the second terminal T2 is lower than the voltage applied to the first terminal T1, as shown in FIG. 6, depletion layers 47 are formed between the P type silicon layer 12, P type semiconductor layer 19, P type isolation region 22 and P type semiconductor layer 23, and the N type silicon layer 11. Under this situation, when light is irradiated on the junction between the P type semiconductor layer 19 and N type silicon layer 11, multiple pairs of electrons and holes are produced in the depletion layer 47 around the P type semiconductor layer 19. The pairs of electrons and holes are separated by an electric field, so that the holes move into the P type semiconductor layer 19 and the electrons travel into the N type silicon layer 11. This raises the potential of the P type semiconductor layer 19 with respect to the N type semiconductor layer 21, thus starting the injection of the electrons from the N type semiconductor layer 21 into the P type semiconductor layer 19. Consequently, the lateral thyristor which is constituted of the fourth terminal electrode 34, N type semiconductor layer 21, P type semiconductor layer 19, N type silicon layer 11, P type semiconductor layer 18 and fifth terminal electrode 35 is turned on.

When this lateral thyristor is turned on, a current it flows through a route of the second terminal electrode 31, P type semiconductor layer 13, gate electrode 33, resistor R1, fifth terminal electrode 35 and P type semiconductor layer 18. This current it becomes a gate trigger current of an operation mode 3 (−) for the output-stage triac 3, so that the output-stage triac 3 is activated in operation mode 3 (−). In this mode 3 (−), the voltage of the gate electrode 33 is lower than that of the second terminal electrode 31, causing currents iA1 and iA2 to flow from the second terminal electrode 31 to the third terminal electrode 32.

According to the first embodiment, as the output-stage triac 3 with a vertical structure which can control a high voltage and large current, and the input/driving-stage triac 4 for driving this triac 3 are formed in the same semiconductor chip 1, a phototriac device usable as a power controller can be accomplished.

The current density per chip's unit area of a conventional lateral type phototriac device of 600 V was 0.2 A/mm² (when Vf=2.0 V).

The current density per chip's unit area of the phototriac device of this embodiment is improved to 0.5 A/mm² (when VF=2.0 V), and can well compete with a vertical type electrically triggered triac.

In the conventional lateral type phototriac device, the distance between the N type emitter region and the P type emitter region should be set longer in order to increase the current density per chip's unit area. This requires that the P type semiconductor layers should be made thinner.

In the phototriac device according to this embodiment of the present invention, the phototriac 4 serves to temporarily supply the trigger current to the gate of the output-stage triac 3. Therefore, the P type semiconductor layers 17, 18, 19 and 23 need not be made so thin.

Figure 7:
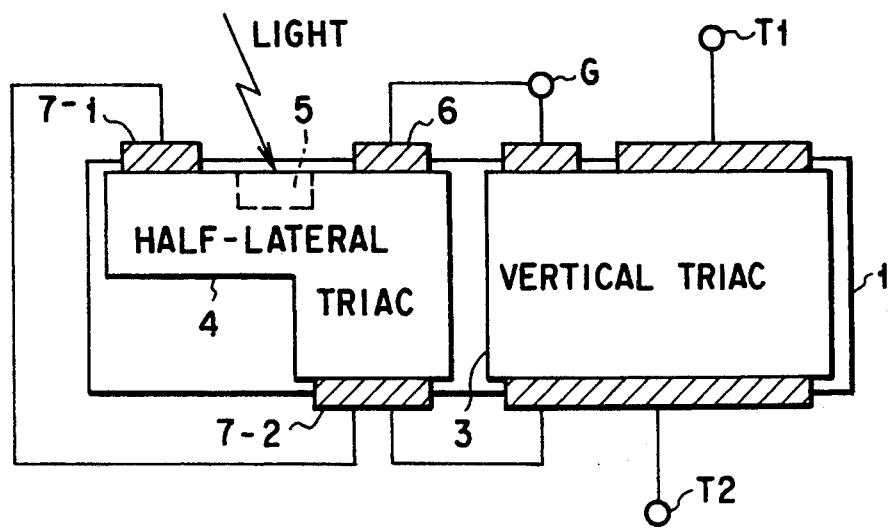
FIG. 7 is a block diagram illustrating the structure of a phototriac device according to a second embodiment of the present invention.

FIG. 7 presents a block diagram illustrating the structure of a phototriac device according to a second embodiment of this invention.

It is apparent from FIG. 7 that the phototriac device of the second embodiment differs from that of the first embodiment in that the triac 4 is a half-lateral triac which has a lateral structure portion and a vertical structure portion.

Figure 8:
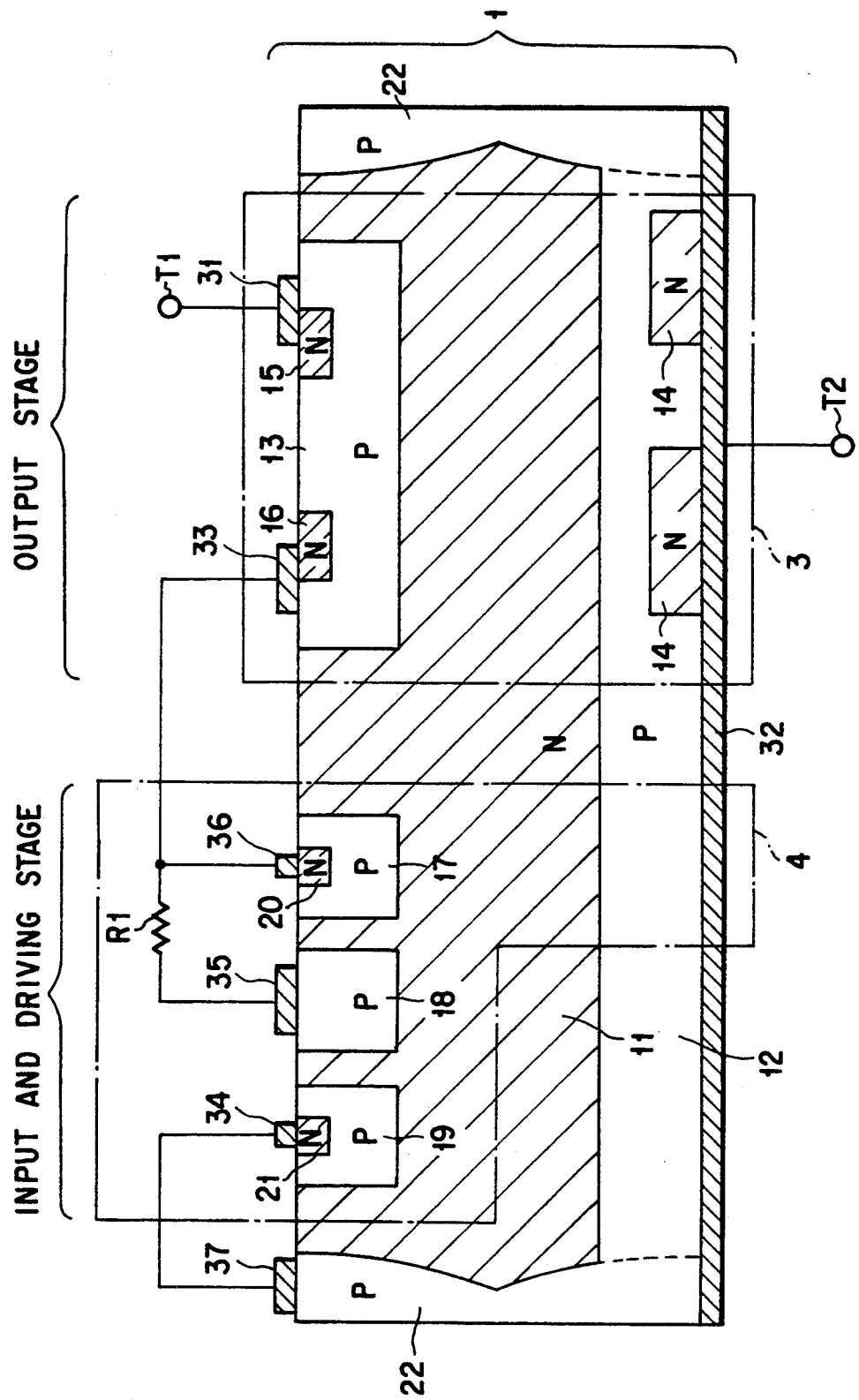
FIG. 8 is a cross section of the phototriac device according to the second embodiment of the present invention.

FIG. 8 presents a cross section of the phototriac device according to the second embodiment of this invention.

As shown in FIG. 8, the semilateral triac 4 includes a vertical thyristor constituted of the P type silicon layer 12, N type silicon layer 11, P type semiconductor layer 17 and N type semiconductor layer 20, and a lateral thyristor constituted of the P type semiconductor layer 18, N type silicon layer 12, P type semiconductor layer 19 and N type semiconductor layer 21. The structure of the other portions is the same as that of the phototriac device of the first embodiment.

The function of the phototriac device will now be described.

The function of the phototriac device of the second embodiment differs from that of the phototriac device of the first embodiment particularly in the function of the input/driving-stage triac 4 to supply the trigger current to the gate of the output-stage triac 3, i.e., in the function in mode 1 (+).

Figure 9:
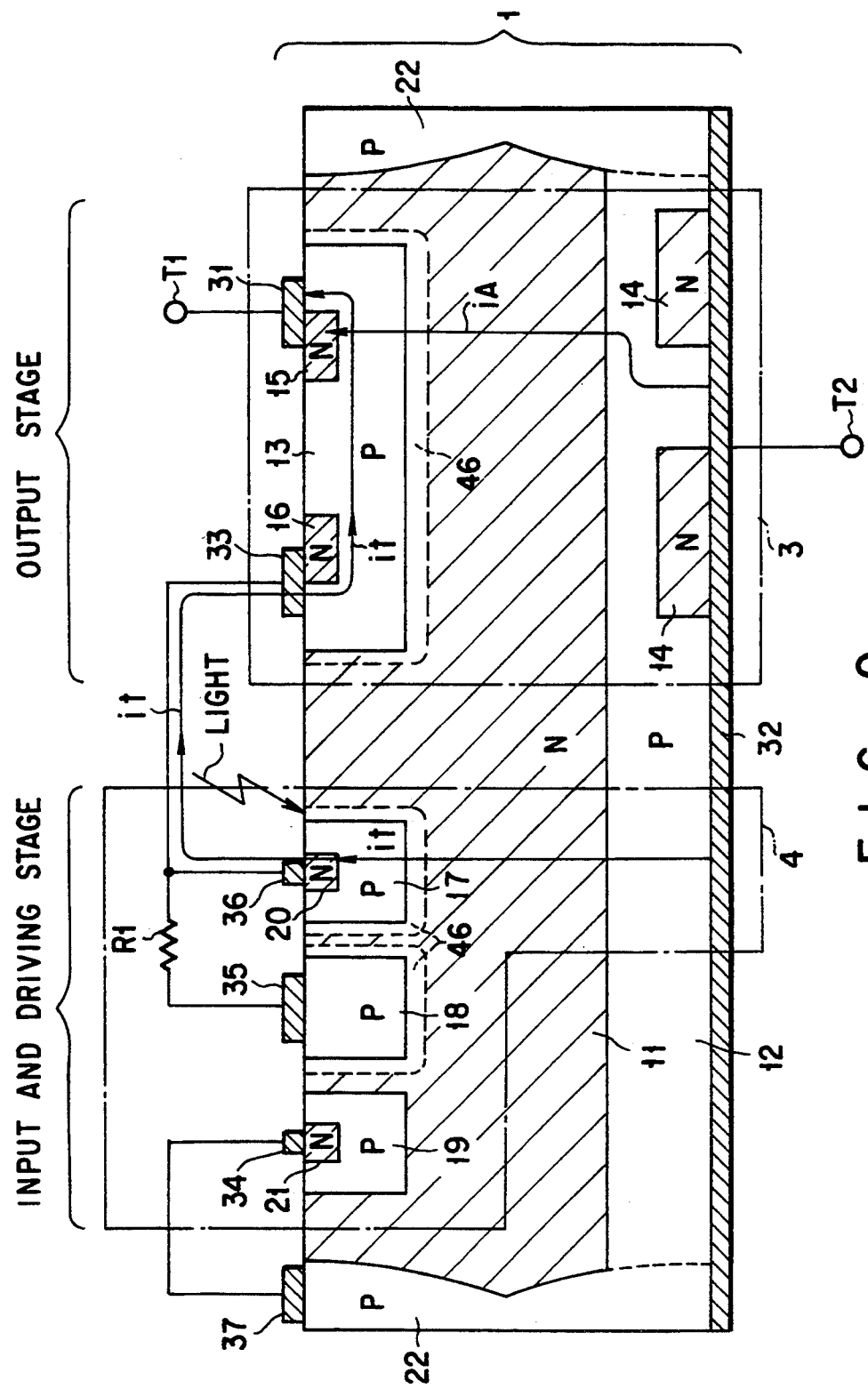
FIG. 9 is a first cross-sectional view for explaining the function of the phototriac device according to the second embodiment of the present invention.

When the voltage applied to the second terminal T2 is higher than the voltage applied to the first terminal T1, as shown in FIG. 9, the depletion layers 46 are formed between the P type semiconductor layer 13, P type semiconductor layer 17 and P type semiconductor layer 18, and the N type silicon layer 11. Under this situation, when light is irradiated on the junction between the P type semiconductor layer 17 and N type silicon layer 11, multiple pairs of electrons and holes are produced in the depletion layer 46 around the P type semiconductor layer 17. The pairs of electrons and holes are separated by an electric field, so that the holes move into the P type semiconductor layer 17 and the electrons move into the N type silicon layer 11. This raises the potential of the P type semiconductor layer 17 with respect to the N type semiconductor layer 20, thus starting the injection of the electrons from the N type semiconductor layer 20 into the P type semiconductor layer 17. As a result, the vertical thyristor which is constituted of the sixth terminal electrode 36, N type semiconductor layer 20, P type semiconductor layer 17, N type silicon layer 11, P type silicon layer 12 and third terminal electrode 32 is turned on.

When the vertical thyristor is turned on, a current flows through a route of the third terminal electrode 32, N type silicon layer 11, P type semiconductor layer 17, N type semiconductor layer 20, gate electrode 33 and P type semiconductor layer 13. This current becomes a gate trigger current of an operation mode 1 (+) for the output-stage triac 3, so that the output-stage triac 3 is activated in operation mode 1 (+). In this mode 1 (+), the voltage of the gate electrode 33 is higher than that of the second terminal electrode 31, causing the current iA to flow from the third terminal electrode 32 to the second terminal electrode 31.

Figure 10:
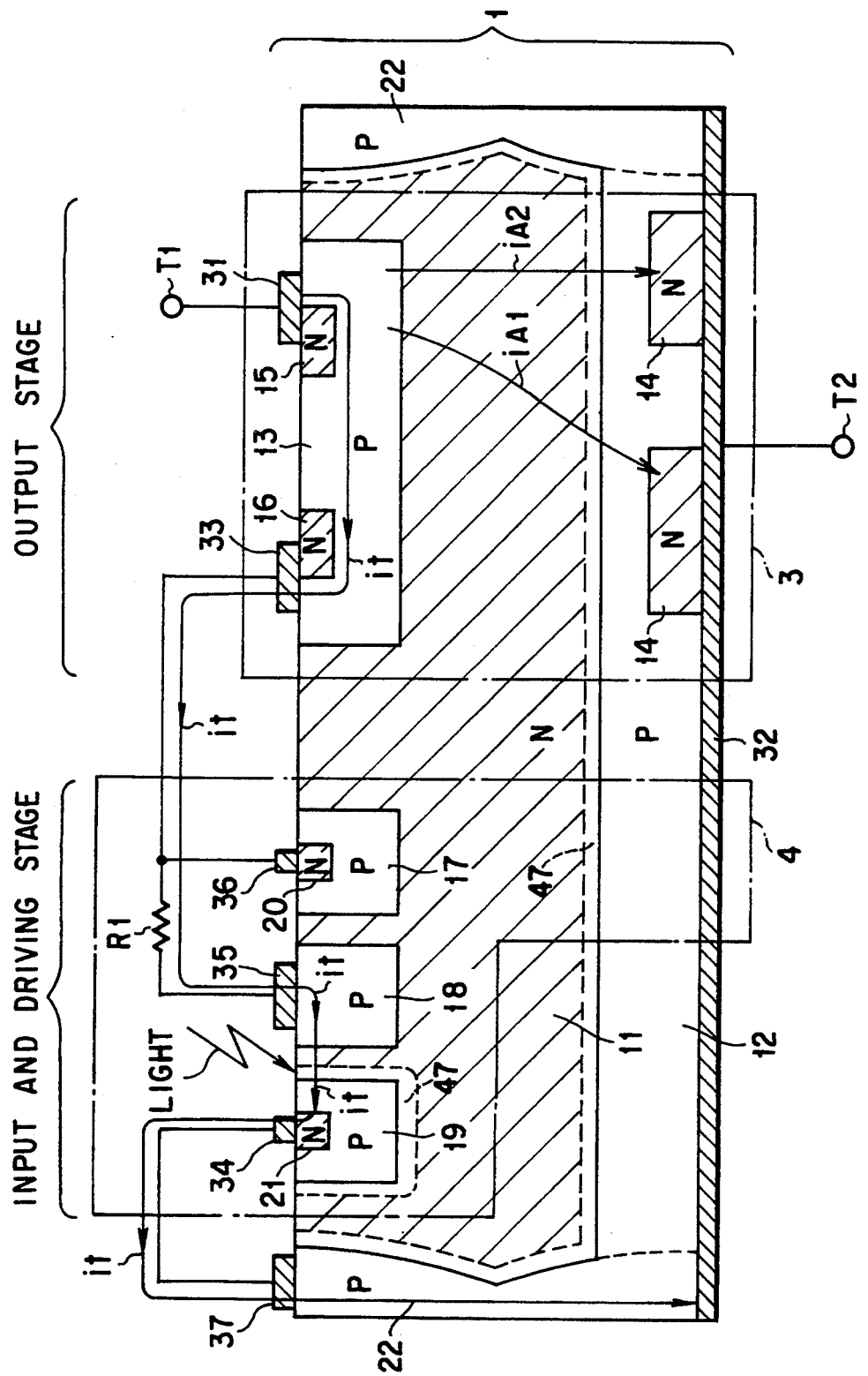
FIG. 10 is a second cross-sectional view for explaining the function of the phototriac device according to the second embodiment of the present invention.

When the voltage applied to the second terminal T2 is lower than the voltage applied to the first terminal T1, as shown in FIG. 10, the depletion layers 47 are formed between the P type silicon layer 12, P type semiconductor layer 19 and P type isolation region 22 and the N type silicon layer 11. Under this situation, when light is irradiated on the junction between the P type semiconductor layer 19 and N type silicon layer 11, the same phenomenon as has been described earlier with reference to FIG. 6 occurs, thus turning on the lateral thyristor which is constituted of the fourth terminal electrode 34, N type semiconductor layer 21, P type semiconductor layer 19, N type silicon layer 11, P type semiconductor layer 18 and fifth terminal electrode 35.

When this lateral thyristor is turned on, the output-stage triac 3 is activated through the same phenomenon as has been described earlier referring to FIG. 6, in operation mode 3 (−) where the voltage of the gate electrode 33 is lower than that of the second terminal electrode 31, causing currents iA1 and iA2 to flow from the second terminal electrode 31 to the third terminal electrode 32.

It is apparent that the phototriac device of the second embodiment can have the same advantage as the phototriac device of the first embodiment.

Although phototriac devices of two embodiments have been described above, the phototriac device of the first embodiment appears to be more suitable in actual use for the following reason.

According to the phototriac device of the first embodiment, since the lateral thyristor supplies both the gate trigger currents in operation mode 1 (+) and operation mode 3 (−) of the output-stage triac 3, the photosensitivity in mode 1 (+) of the output-stage triac 3 can be matched with that in mode 3 (−) more accurately.

Figure 11:
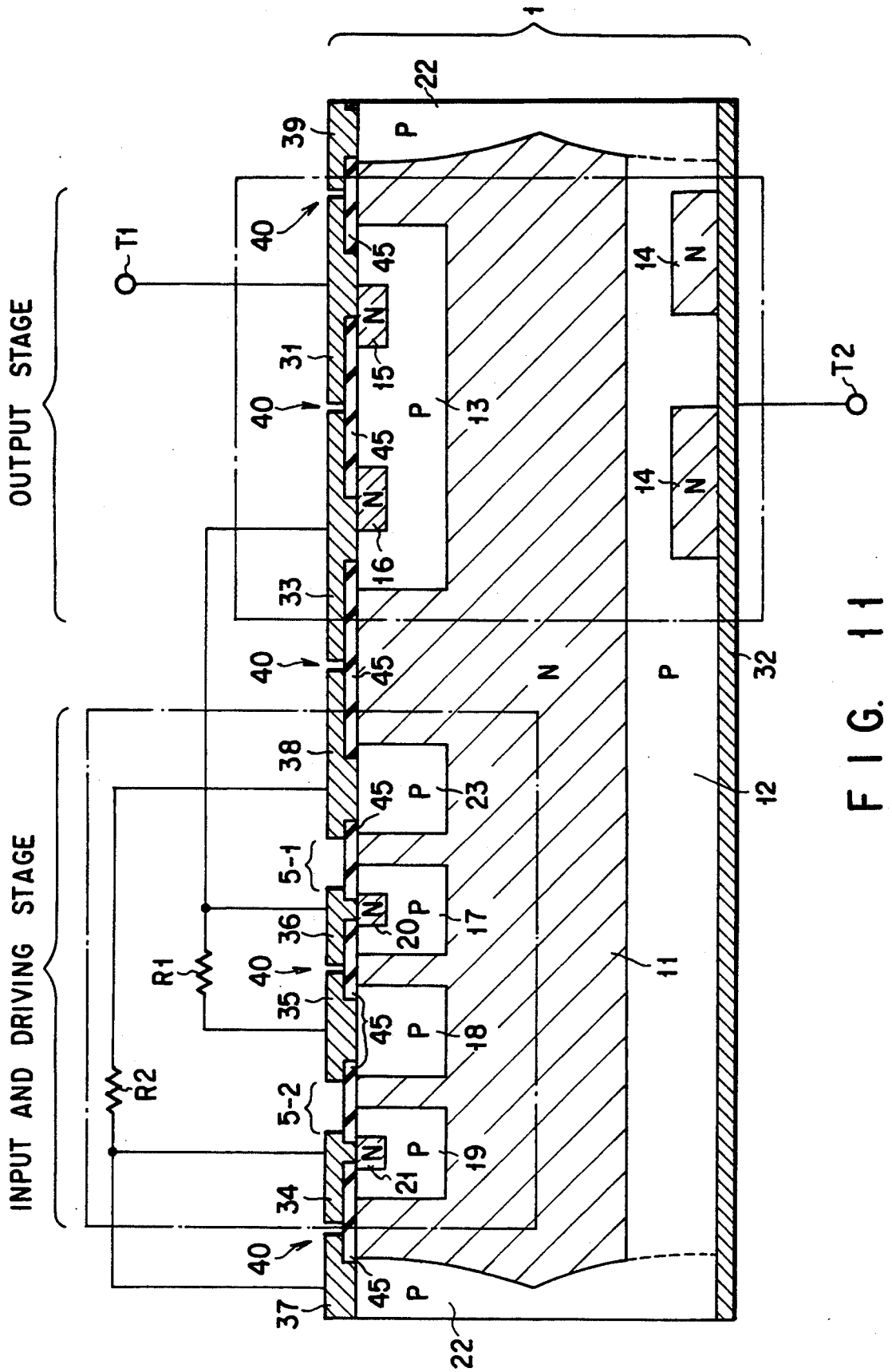
FIG. 11 is a cross section of a phototriac device according to a modification of the present invention.

To prevent unnecessary light from entering the input/driving-stage triac, it is desirable to change the electrode pattern as shown in FIG. 11.

FIG. 11 shows the cross section of a phototriac device according to a modification of the present invention.

In this modification, the gaps between the first terminal electrode 37 and fourth terminal electrode 34, between the fifth terminal electrode 35 and sixth terminal electrode 36, between the seventh terminal electrode 38 and gate electrode 33, between the gate electrode 33 and second terminal electrode 31 and between the second terminal electrode 31 and a field plate electrode 39 are made narrower as indicated by reference numerals "40" in FIG. 11.

Further, the gaps between the sixth terminal electrode 36 and seventh terminal electrode 38, and between the fourth terminal electrode 34 and fifth terminal electrode 35 are widened as indicated by reference numerals "5-1" and "5-2" in FIG. 11, so that sufficient amounts of light can be irradiated on the junction between the P type semiconductor layer 17 and N type silicon layer 11 and the junction between the P type semiconductor layer 19 and N type silicon layer 11.

With the use of the electrode pattern shown in FIG. 11, only the junction between the P type semiconductor layer 17 and N type silicon layer 11 and the junction between the P type semiconductor layer 19 and N type silicon layer 11 are exposed to light, while the other PN junctions are all covered with the electrode pattern.

The electrodes 31, 33, 34, 35, 36, 37, 38 and 39 are formed of a conductive material essentially consisting of aluminum, such a conductive material reflects light. That is, light will be irradiated on the PN junctions which are not covered with the electrodes, not on the PN junctions which are covered with the electrodes.

This design permits light irradiation only on the selected PN junctions, thus preventing unnecessary generation of pairs of electrons and holes. This modification can therefore improve the functional reliability of the phototriac device and is advantageous over the phototriac devices of the first and second embodiments.

The field plate electrode 39 shown in FIG. 11 electrode covers the junction between the N type silicon layer 11 and isolation region 22 and extends over the N type silicon layer 11, thus relaxing the concentration of the electric field onto that junction on the N type silicon surface.

In addition, as the first terminal electrode 37 and field plate electrode 39 are of the same potential, the first terminal electrode 37, if designed to cover the junction between the N type silicon layer 11 and isolation region 22 and extend over the N type silicon layer 11, thus relaxing the concentration of the electric field onto that junction on the N type silicon surface.

As described above, since the output-stage triac having a vertical structure to ensure control of a high voltage and large current and the phototriac for driving the gate of the former triac are formed in the same semiconductor device, it is possible to accomplish a phototriac device which can be used to control power and a method of driving this phototriac device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    an output Triode AC switch provided in said substrate, said output Triode AC switch having a gate, a first terminal and a second terminal, and having a vertical structure; and
    an input/driving Triode AC switch provided in said substrate and having a light-receiving portion, a third terminal connected to said gate of said output Triode AC switch and a fourth terminal connected to said first terminal of said output Triode AC switch.

2. A semiconductor device according to claim 1, where said substrate includes:
    a first semiconductor layer of a first conductivity type having first and second major surfaces;
    a second semiconductor layer of a second conductivity type provided in said first major surface region of said first semiconductor layer;
    a first semiconductor region of said first conductivity type provided in said second semiconductor layer in contact with said first semiconductor layer; and
    a first electrode provided in contact with said first semiconductor region;
    said output Triode AC switch includes:
    said first semiconductor layer;
    said second semiconductor layer;

a second semiconductor region of said first conductivity type provided in a surface region of said second semiconductor layer;
a third semiconductor region of said second conductivity type provided in a surface region of said second semiconductor region;
a fourth semiconductor region of said second conductivity type provided in said surface region of said second semiconductor region;
a fifth semiconductor region of said second conductivity type provided in said second major surface region of said first semiconductor layer;
a second electrode provided in contact with said second semiconductor region and said third semiconductor region, said second electrode serving as said second terminal;
a third electrode provided in contact with said second semiconductor region and said fourth semiconductor region, said third electrode serving as said gate; and
a fourth electrode provided in contact with said first semiconductor layer and said fifth semiconductor region, said third electrode serving as said first terminal;
said input/driving Triode AC switch includes:
said second semiconductor layer;
a sixth semiconductor region of said first conductivity type provided in said surface region said second semiconductor layer;
a seventh semiconductor region of said first conductivity type provided in said surface region of said second semiconductor layer;
an eighth semiconductor region of said first conductivity type provided in said surface region of said second semiconductor layer;
a ninth semiconductor region of said first conductivity type provided in said surface region of said second semiconductor layer;
a tenth semiconductor region of said second conductivity type provided in a surface region of said sixth semiconductor region;
an eleventh semiconductor region of said second conductivity type provided in a surface region of said seventh semiconductor region;
a fifth electrode provided in contact with said tenth semiconductor region, said fifth electrode being electrically connected to said first electrode;
a sixth electrode provided in contact with said eleventh semiconductor region, said sixth electrode being electrically connected to said third electrode;
a seventh electrode provided in contact with said eighth semiconductor region, said seventh electrode being electrically connected via a first resistor to said fifth electrode; and
an eighth electrode provided in contact with said ninth semiconductor region, said eighth electrode being electrically connected via a second resistor to said sixth electrode.

3. A semiconductor device according to claim 1, where said substrate includes:
a first semiconductor layer of a first conductivity type having first and second major surfaces;
a second semiconductor layer of a second conductivity type provided in said first major surface region of said first semiconductor layer;
a first semiconductor region of said first conductivity type provided in said second semiconductor layer in contact with said first semiconductor layer; and a first electrode provided in contact with said first semiconductor region;
said output Triode AC switch includes:
said first semiconductor layer;
said second semiconductor layer;
a second semiconductor region of said first conductivity type provided in a surface region of said second semiconductor layer;
a third semiconductor region of said second conductivity type provided in a surface region of said second semiconductor region;
a fourth semiconductor region of said second conductivity type provided in said surface region of said second semiconductor region;
a fifth semiconductor region of said second conductivity type provided in said second major surface region of said first semiconductor layer;
a second electrode provided in contact with said second semiconductor region and said third semiconductor region, said second electrode serving as said second terminal;
a third electrode provided in contact with said second semiconductor region and said fourth semiconductor region, said third electrode serving as said gate; and
a fourth electrode provided in contact with said first semiconductor layer and said fifth semiconductor region, said third electrode serving as said first terminal;
said input/driving Triode AC switch includes:
said first semiconductor layer;
said second semiconductor layer;
a sixth semiconductor region of said first conductivity type provided in said surface region of said second semiconductor layer;
a seventh semiconductor region of said first conductivity type provided in said surface region of said second semiconductor layer;
an eighth semiconductor region of said first conductivity type provided in said surface region of said second semiconductor layer;
a ninth semiconductor layer of said second conductivity type provided in a surface region of said sixth semiconductor region;
a tenth semiconductor region of said second conductivity type provided in a surface region of said seventh semiconductor region;
a fifth electrode provided in contact with said ninth semiconductor region, said fifth electrode being electrically connected to said first electrode;
a sixth electrode provided in contact with said tenth semiconductor region, said sixth electrode being electrically connected to said third electrode; and
a seventh electrode provided in contact with said eight semiconductor region, said seventh electrode being electrically connected via a resistor to said sixth electrode.

4. A semiconductor device according to claim 2, wherein said input/driving Triode AC switch is triggered by light received at one of a junction between said second semiconductor layer and said sixth semiconductor region and a junction between said second semiconductor layer and said seventh semiconductor region.

5. A semiconductor device according to claim 3, wherein said input/driving Triode AC switch is triggered by light received at one of a junction between said second semiconductor layer and said sixth semiconductor layer and a junction between said second semiconductor layer and said seventh semiconductor region.

6. A semiconductor device comprising:
   a semiconductor substrate having a top surface and a back surface;
   a first Triode AC switch provided in said substrate, said first Triode AC switch having a first terminal provided on said top surface of said substrate, a gate provided on said top surface of said substrate and a second terminal provided on said back surface of said substrate; and
   a second Triode AC switch provided in said substrate, and having a third terminal provided on said top surface of said substrate connected to said gate and a fourth terminal provided on said top surface of said substrate connected to said second output terminal, said second Triode AC switch being triggered by received light.

7. A method of driving a semiconductor device comprising a semiconductor substrate, an output Triode AC switch with a vertical structure, provided in said substrate and having a gate, a first terminal and a second terminal, and an input/driving Triode AC switch provided in said substrate and having a light-receiving portion, a third terminal connected to said gate of said output Triode AC switch and a fourth terminal connected to said first terminal thereof, said method comprising the steps of:
   applying an AC voltage between said first and second terminal of said output Triode AC switch; and
   irradiating light onto said light-receiving portion of said input/driving Triode AC switch.

* * * * *